United States Patent [19]
Sasaoka et al.

[11] Patent Number: 6,166,321
[45] Date of Patent: *Dec. 26, 2000

[54] TERMINAL BOX FOR A SOLAR CELL MODULE AND A SOLAR CELL MODULE PROVIDED WITH SAID TERMINAL BOX

[75] Inventors: Makoto Sasaoka; Fumitaka Toyomura, both of Kyotanabe, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/099,953

[22] Filed: Jun. 19, 1998

[30] Foreign Application Priority Data

Jun. 24, 1997 [JP] Japan ................................. 9-166915

[51] Int. Cl.[7] .................................................. H01L 25/00
[52] U.S. Cl. ..................................... 136/251; 136/256
[58] Field of Search ...................... 136/251, 256

[56] References Cited

U.S. PATENT DOCUMENTS

| | | | |
|---|---|---|---|
| 4,371,739 | 2/1983 | Lewis et al. | 136/251 |
| 4,457,578 | 7/1984 | Taylor | 136/251 |
| 5,268,038 | 12/1993 | Riermeier et al. | 136/251 |
| 5,280,133 | 1/1994 | Nath | 136/251 |

*Primary Examiner*—Mark Chapman
*Attorney, Agent, or Firm*—Fitzpatrick, Cella, Harper & Scinto

[57] ABSTRACT

A terminal box which is provided at an electrode-taking out portion of a solar cell module, includes, a side face having a portion for threading an externally power outputting cable, a portion for adopting an internal lead wire extended from the electrode-taking out portion of said solar cell module, and a trunk terminal. A trunk terminal support is connected with the trunk terminal, which is used for electrically connecting the externally power outputting cable with the internal lead wire. A solar cell module provided with the terminal box.

46 Claims, 6 Drawing Sheets

TERMINAL BOX FOR A SOLAR CELL MODULE AND A SOLAR CELL MODULE PROVIDED WITH SAID TERMINAL BOX

BACKGROUND OF THE INVENTION

1. Field of the Invention

The present invention relates to an improved terminal box for a solar cell module and a solar cell module provided with said terminal box. More particularly, the present invention relates to an improved, highly reliable terminal box for a solar cell module, said terminal box being capable of being readily handled and capable of being produced at a reasonable production cost, and a solar cell module provided with said terminal box.

2. Related Background Art

There have been proposed a number of solar cell modules comprising a solar cell (a photovoltaic element) sealed by a resin, a surface protective member which covers a front side (a light receiving side) of said solar cell, and a back side protective member which covers a back side of said solar cell.

Any of these solar cell modules is usually designed to have a pair of power-outputting portions each comprising a terminal-taking out box (this box will be hereinafter referred to as "terminal box"), where each terminal box is fixed to a predetermined position of the rear face of the solar cell module by means of an adhesive comprising silicone resin or epoxy resin, and an externally power outputting cable from each terminal box is extended to the outside. Each terminal box has such a terminal board structure that the power outputting cable is fixed to a terminal board provided in said terminal box together with one of pair of a internal lead wires extended from an electrode-taking out portion of the solar cell of the solar cell module, where the power outputting cable and the internal lead wire are electrically connected through the terminal board.

The fixation of the power outputting cable and the internal lead wire to the terminal board in this case is usually conducted by way of screwing, soldering, or riveting. Of these fixing means, screwing is frequently employed.

In the case of the terminal board structure in which the power outputting cable and the internal lead wire are together fixed to the terminal board by way of ordinary screwing means, the screwing means is based on a combination of a male screw and a means corresponding to a female screw, such as a press-in nut, built-in nut, or female screw-like portion prepared by way of tapping. However, this fixing manner is disadvantageous in that many parts are used, and many routines are required, resulting in making a product relatively costly. There is also a disadvantage in terms of the working efficiency such that due care should be made about torque and the like upon the thread fastening. In addition, the power outputting cable and the internal lead wire are independent single materials which eventually increase the number of parts required in order to fix these to the terminal board, and this situation complicates the fixing works to establish a desirable terminal board structure in the terminal box.

Hence, for the conventional terminal box, there are subjects to be improved in terms of the production cost and working efficiency.

SUMMARY OF THE INVENTION

A principal object of the present invention is to eliminate the foregoing disadvantages found in the prior art and to provide an improved, less-expensive terminal box for a solar cell module, which can be readily installed; and a solar cell module provided with said terminal box.

Another object of the present invention is to provide a highly reliable terminal box for a solar cell module, said terminal box comprising a diminished number of parts involved and being capable of simplifying the routine works required for its installation; and a solar cell module provided with said terminal box.

A further object of the present invention is to provide a highly reliable terminal box for a solar cell module, said terminal box having a simplified connection structure through which an internal lead wire extended from an electrode-taking out portion of a solar cell module is connected with an externally power outputting cable, said simplified connection structure being housed in said terminal box, said terminal box being capable of being readily installed to cap said electrode-taking out portion of said solar cell module in a desirably fitted state at an improved working efficiency; and a solar cell module provided with said terminal box.

A further object of the present invention is to provide a highly reliable terminal box for a solar cell module, said terminal box being substantially free of a variation in terms of the performance and capable of being readily installed in a desirably fitted state with an improved strength and without causing any negative electrical problems; and a solar cell module provided with said terminal box.

A further object of the present invention is to provide a highly reliable terminal box which is provided at an electrode-taking out portion of a solar cell module, said terminal box comprising a side face having a portion for threading an externally power outputting cable, a portion for adopting an internal lead wire extended from said electrode-taking out portion of said solar cell module, and a trunk terminal, and a trunk terminal support connected with said trunk terminal, wherein said trunk terminal is used for electrically connecting said externally power outputting cable with said internal lead wire.

A further object of the present invention is to provide a solar cell module comprising a photovoltaic element (a solar cell) sealed by a sealing material, an electrode-taking out portion having a pair of internal lead wires for outputting power generated by said photovoltaic element, a pair of external cables for externally outputting said power outputted through said pair of internal lead wires to the outside through a trunk terminal, and a pair of terminal boxes provided at said electrode-taking out portion, wherein each terminal box comprises a side face having a portion for threading said externally power outputting cable, a portion for adopting said internal lead wire, a trunk terminal support connected with said trunk terminal.

BRIEF DESCRIPTION OF THE DRAWINGS

FIGS. 7(*a*) and 7(*b*) are schematic views illustrating an example of a trunk terminal support in the present invention, where

DETAILED DESCRIPTION OF THE INVENTION AND PREFERRED EMBODIMENTS

Figure 1:
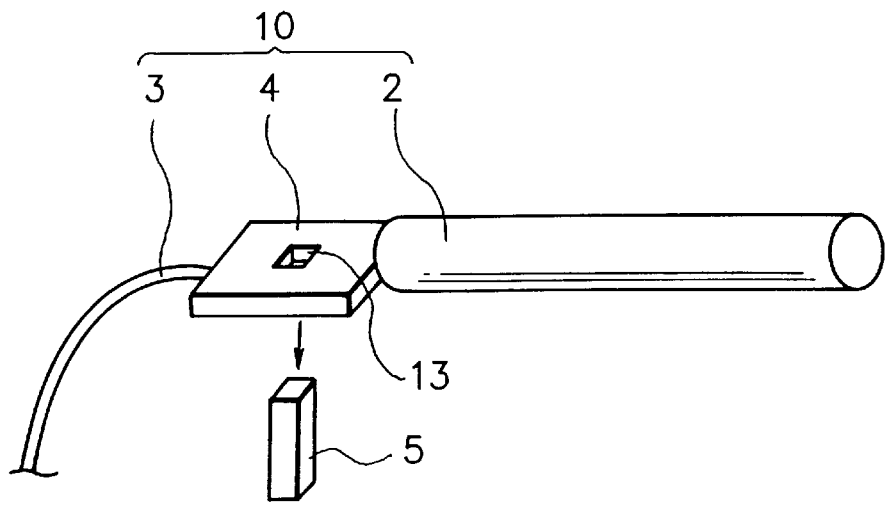
FIGS. 1, 2, 3 and 8 are schematic explanatory views for explaining an embodiment of a terminal box comprising a trunk terminal and a trunk terminal support according to the present invention.

The present invention is to eliminate the foregoing problems found in the prior art and to attain the above described objects.

As previously described, the present invention provides a highly reliable terminal box for a solar cell module, said terminal box comprising a side face having a portion for threading an externally power outputting cable, a portion for adopting an internal lead wire from said electrode-taking out portion of said solar cell module, and a trunk terminal support with which a trunk terminal is meshed, wherein said trunk terminal is used for electrically connecting said externally power outputting cable with said internal lead wire.

A typical specific embodiment of the terminal box according to the present invention is a terminal box for a solar cell module, having a side face with an opening through which an externally power outputting cable is threaded and a bottom face with an opening through which an internal lead wire from an electrode-taking out portion of a solar cell module, wherein said externally power outputting cable and said internal lead wire are electrically and mechanically connected to each other through a trunk terminal to form an integrated structure in said terminal box, said trunk terminal being mechanically meshed with a trunk terminal support provided in said terminal box.

The present invention also provides a solar cell module provided with said terminal box.

The terminal box according to the present invention is characterized by having a simplified connection structure in which an externally power outputting cable is desirably connected with an internal lead wire extended from an electrode-taking out portion of a solar cell module, said simplified connection structure being housed in the terminal box. The terminal box can be readily installed to cap said electrode-taking out portion of the solar cell module in a desirably fitted state at an improved working efficiency. The terminal box thus installed excels in reliability. And the terminal box according to the present invention can be attained at a reasonable cost.

The terminal box according to the present invention is required to be such that it excels in heat resistance, waterproof and aging resistance and has excellent electrically insulating properties. Besides, the terminal box is desired to have good adhesion with a filler material or a back face reinforcing member used in a solar cell module.

Although there is no particular limitation for the constituent of the terminal box, taking the above requirements into consideration, the terminal box is desired to be constituted by an appropriate plastic material. In order for the terminal box to have fire resistance while satisfying the above requirements, the terminal box is desired to be constituted by a material selected from the group consisting of fire resistant plastics, semi-fire resistant plastics and ceramics.

Such plastic can include engineering plastics which excel in physical strength, shock resistance, heat resistance, hardness, and aging resistance. Specific examples are polycarbonate, polyamide, polyacetal, modified PPE (polyphenylene ether), polyester, polyarylate, unsaturated polyester, phenol resin, and epoxy resin. Besides, thermoplastics such as ABS resin (acrylonitrile butadiene styrene polymer), PP (polypropylene), and PVC (polyvinyl chloride) are also usable depending upon the situation involved. In order to improve the resistance to ultraviolet rays, the constituent of the terminal box may contain a pigment comprising carbon black. Alternatively, it is possible for the surface of the terminal box to be coated by a resin coating capable of absorbing ultraviolet rays.

As above described, in the terminal box according to the present invention, there is provided an integrated connection structure in which an externally power outputting cable is electrically and mechanically connected with an internal lead wire (which is extended from an electrode-taking out portion of a solar cell module) through a trunk terminal, where the trunk terminal is mechanically connected to a trunk terminal support provided in the terminal box.

Figure 2:
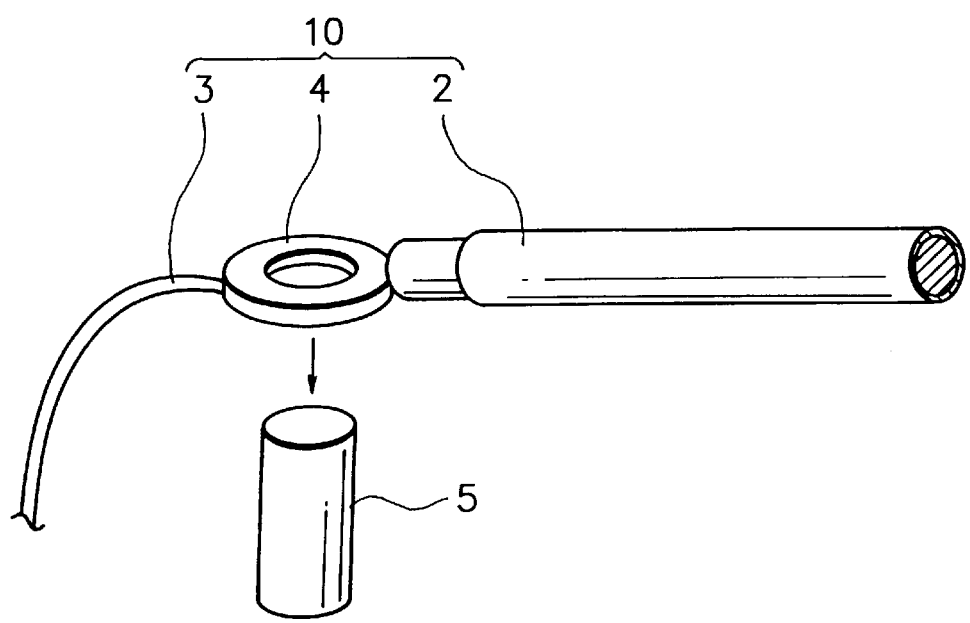

The mechanical connection of the trunk terminal to the trunk terminal support may be conducted, for instance, in a simple manner as shown in FIG. 1 or FIG. 2 in which a bar-like shaped trunk terminal support 5 is passed through a latching portion 13 bored at a trunk terminal 4, whereby the trunk terminal is mechanically connected with the trunk terminal support. Herein, in FIGS. 1 and 2, reference numeral 2 indicates an externally power outputting cable which is connected to the trunk terminal 4, reference numeral 3 an internal lead wire (extended from an electrode-taking out portion of a solar cell module) which is connected to the trunk terminal 4, and reference numeral 10 an integrated structure as an integrated power outputting unit.

In any of the mechanical connection manners shown in FIGS. 1 and 2, it is desired that the trunk terminal support 5 is made of a resin, and after the trunk terminal 4 is connected with the trunk terminal support 5 in the above described manner, a part of the trunk terminal support 5 (that is, a head portion of the trunk terminal support 5 which is projected above the trunk terminal 4) is caulked by way of heat treatment or ultrasonic treatment to improve the reliability of the connection portion between the trunk terminal and the trunk terminal support.

Figure 3:
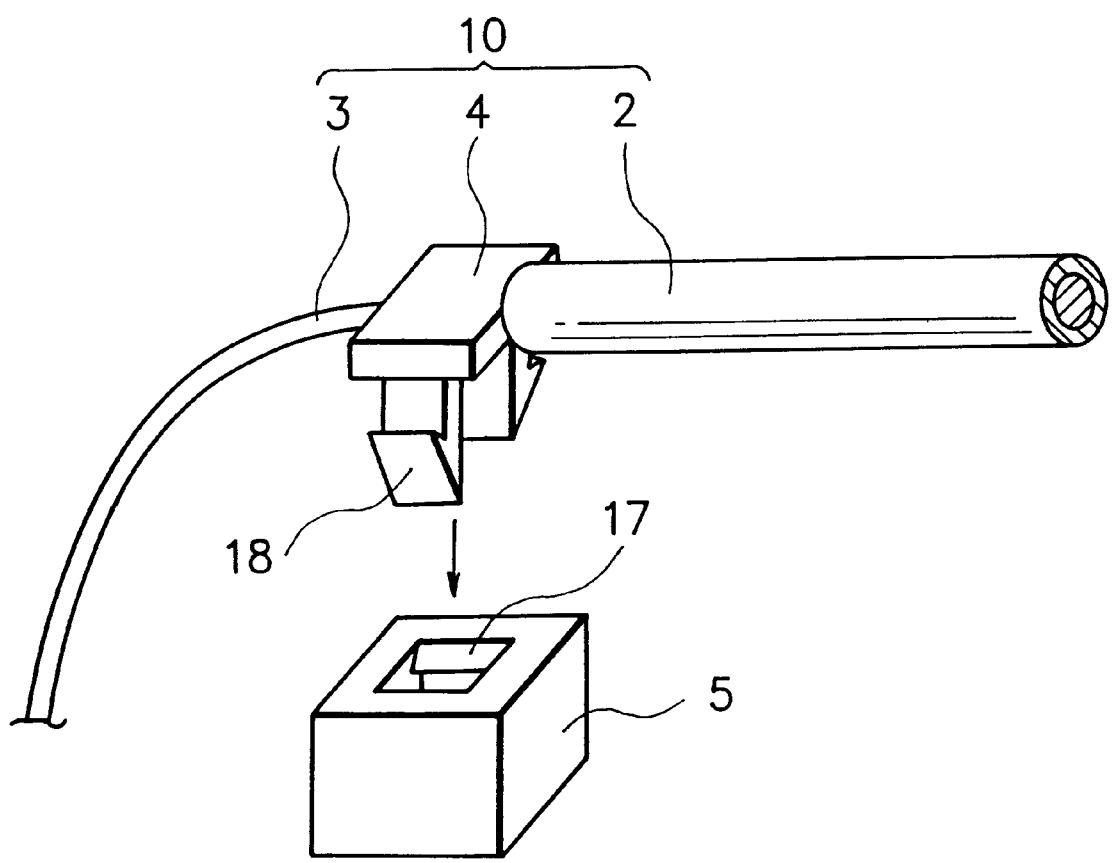

Besides, the mechanical connection of the trunk terminal with the trunk terminal support may be also conducted in a simple manner as shown in FIG. 3. In FIG. 3, reference numeral 4 indicates a trunk terminal provided with a pair of meshing portions 18, reference numeral 2 an externally power outputting cable connected to the trunk terminal 4, reference numeral 3 an internal lead wire (extended from an electrode-taking out portion of a solar cell module) which is connected to the trunk terminal 4, reference numeral 5 a trunk terminal support having a bored latching portion provided with a pair of receiving members 17 in which the pair of meshing portions 18 of the trunk terminal 4 are to be engaged, and reference numeral 10 an integrated structure as an integrated power outputting unit.

The mechanical connection of the trunk terminal with the trunk terminal support in the manner shown in FIG. 3 may be conducted simply by inserting the meshing portions 18 of the trunk terminal 4 into the bored latching portion of the trunk terminal support 5 to engage the meshing portions 18 of the trunk terminal 4 in the receiving members 17 of the trunk terminal support 5, whereby the trunk terminal 4 is mechanically connected with the trunk terminal support 5. This connection manner shown in FIG. 3 is based on so-called snap-fitting.

In the manner shown in FIG. 3, it is possible that the trunk terminal 4 is designed to have a pair of receiving members 17 and the trunk terminal support 5 is designed to have a pair of meshing portions 18 corresponding to the receiving member 17 of the trunk terminal 4.

In the present invention, the foregoing manners for mechanically connecting the trunk terminal with the trunk terminal support and the foregoing configurations and the like of the trunk terminal and trunk terminal support are not limitative. These may be optionally modified as long as the mechanical connection of the trunk terminal with the trunk terminal support can be simply conducted as desired.

As apparent from the above description, the terminal box according to the present invention is configured such that in the terminal box, the externally power outputting cable and the internal lead wire (comprising an internal lead wire extended from an electrode-taking out portion of a solar cell module) are electrically and mechanically connected through the trunk terminal to establish an integrated connection structure (namely, an integrated power outputting unit), where the trunk terminal is surely held by the trunk terminal support which is mechanically connected with the trunk terminal in such a simple manner as previously described. Because of this, the terminal box according to the present invention is significantly advantageous in that the number of the parts involved for the formation of the terminal box is apparently smaller than that in the prior art, the structure of the terminal box is apparently simpler than that of the conventional terminal box, and the terminal box can be provided at a reasonable production cost.

The terminal box according to the present invention has further significant advantages as will be described in the following. In the terminal box according to the present invention, because the externally power outputting cable and the internal lead wire are connected through the trunk terminal and the trunk terminal is mechanically fixed to the trunk terminal support, an external force transmitted from the externally power outputting cable is applied to the fixed face of the terminal box through the trunk terminal support, where the electrode-taking out portion of the solar cell module (from which the internal lead wire is extended) is substantially not suffered from the external force from the externally power outputting cable. Therefore, the connection portions of the wirings are maintained in highly reliable states.

The present invention provides also such advantages as will be described in the following. That is, the operation for establishing the foregoing integrated connection structure (the integrated power outputting unit) in the terminal box can be efficiently conducted simply by passing the trunk terminal support through the latching portion bored at the trunk terminal whereby mechanically connecting the trunk terminal with the trunk terminal support (see, FIGS. 1 and 2) or by inserting the meshing portions provided at the trunk terminal into the bored latching portion (provided with the receiving members) of the trunk terminal support to engage the meshing portions of the trunk terminal in the receiving members of the trunk terminal support whereby mechanically connecting the trunk terminal with the trunk terminal support (see, FIG. 3). This situation enables to attain highly reliable terminal box products which are substantially free of not only a variation in terms of not only the strength but also the electrical performance among the products.

In the following, the present invention will be described in more detail with reference to examples. It should be understood that these examples are only for illustrative purposes and the present invention is not restricted to these examples.

EXAMPLE 1

Figure 4:
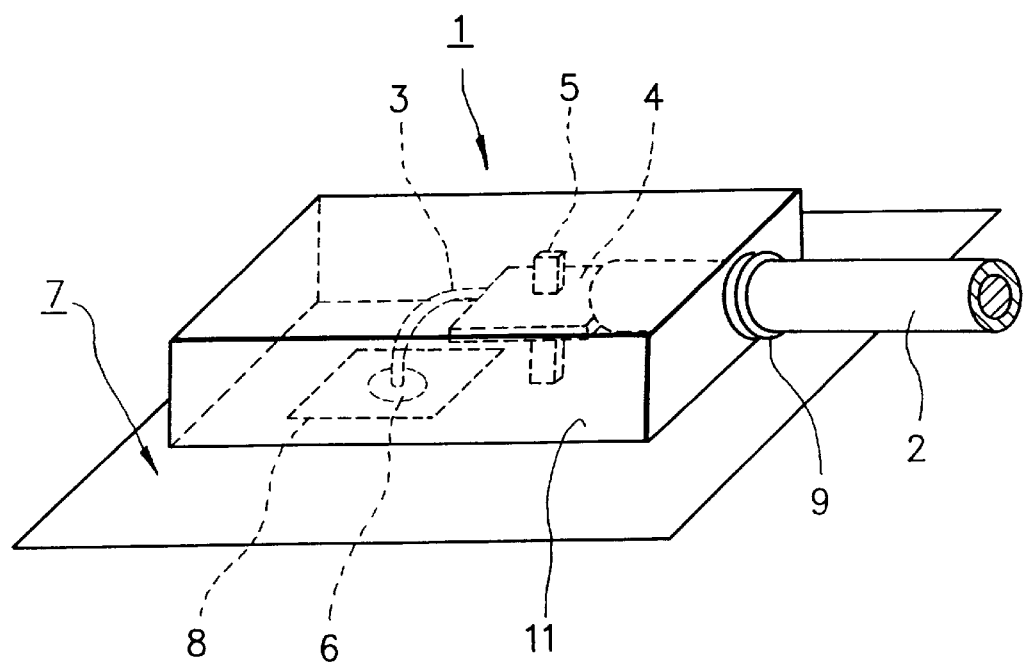
FIG. 4 is a schematic perspective view illustrating an example of a solar cell module according to the present invention.

FIG. 4 is a schematic perspective view illustrating an example of a solar cell module 7 according to the present invention, which is provided with a terminal box 1 according to the present invention. Herein, the foregoing manner shown in FIG. 1 for connecting the trunk terminal 4 with the trunk terminal support 5 can be employed in the terminal box 1 shown in FIG. 4.

As shown in FIG. 4, the terminal box 1 comprising an injection molded product made of a resin is fixed to the solar cell module 7 such that it covers an electrode-taking out portion 6 (of the solar cell module) from which an internal lead wire 3 is extended to the outside. The terminal box has a bottom face provided with an opening 8 for entrapping the internal lead wire 3, and it also has a side face provided with an opening 9 for taking out through the opening 9 an externally power outputting cable 2 from the inside of the terminal box to the outside. In the terminal box 1, there is provided a trunk terminal 4 in a rectangular form which is surely held by a trunk terminal support 5 in a prismatic form which is mechanically fixed to the trunk terminal 4 in a simple manner as previously described with reference to FIG. 1.

In the inside of the terminal box 1, the internal lead wire 3 and the externally power outputting cable 2 are electrically and mechanically connected to each other through the trunk terminal 4 to establish an integrated power outputting unit. This integrated power outputting unit is surely held by the trunk terminal support 5 which is mechanically connected with the trunk terminal 4 in a simple manner as previously described with reference to FIG. 1 in which the trunk terminal support (in a bar-like form) is passed through the latching portion bored at the trunk terminal, whereby the trunk terminal is mechanically connected with the trunk terminal support.

In the structure configured as shown in FIG. 4, an external force transmitted from the externally power outputting cable 2 is applied to a fixed face 11 of the terminal box 1 through the trunk terminal support 5 and because of this, the electrode-taking out portion 6 (of the solar cell module) from which the internal lead wire 3 is extended is substantially not suffered from the external force from the externally power outputting cable.

Hence, the wirings in the terminal box 1 can be firmly and surely conducted by extremely simple routine work.

EXAMPLE 2

This example is the same as Example 1, except that the connection manner previously described with reference to FIG. 2 in which the trunk terminal 4 is connected with the trunk terminal support 5 is employed.

This example is different from Example 1 only with the following points.

In this example, the rectangular trunk terminal 4 in Example 1 is changed to a trunk terminal in a circular form and the prismatic trunk terminal support 5 in Example 1 is changed to a trunk terminal support in a cylindrical form (see, FIG. 2).

In this example, the internal lead wire 3 and the externally power outputting cable 2 are together caulked by the circular trunk terminal 4 so that they are electrically and mechanically connected to each other through the circular trunk terminal. The cylindrical trunk terminal support 5 is designed so that it can pass through a latching opening formed at the circular trunk terminal 4. By this, the circular trunk terminal 4 can be mechanically connected with the cylindrical trunk terminal support 5 such that the circular trunk terminal is firmly held by the cylindrical trunk terminal support.

In the structure of this example, as well as in the case of Example 1, an external force transmitted from the externally power outputting cable 2 is substantially not applied to the electrode-taking out portion (of the solar cell module) from which the internal lead wire is extended.

And the wirings in the terminal box 1 can be firmly and surely conducted by extremely simple routine work.

EXAMPLE 3

Figure 5:
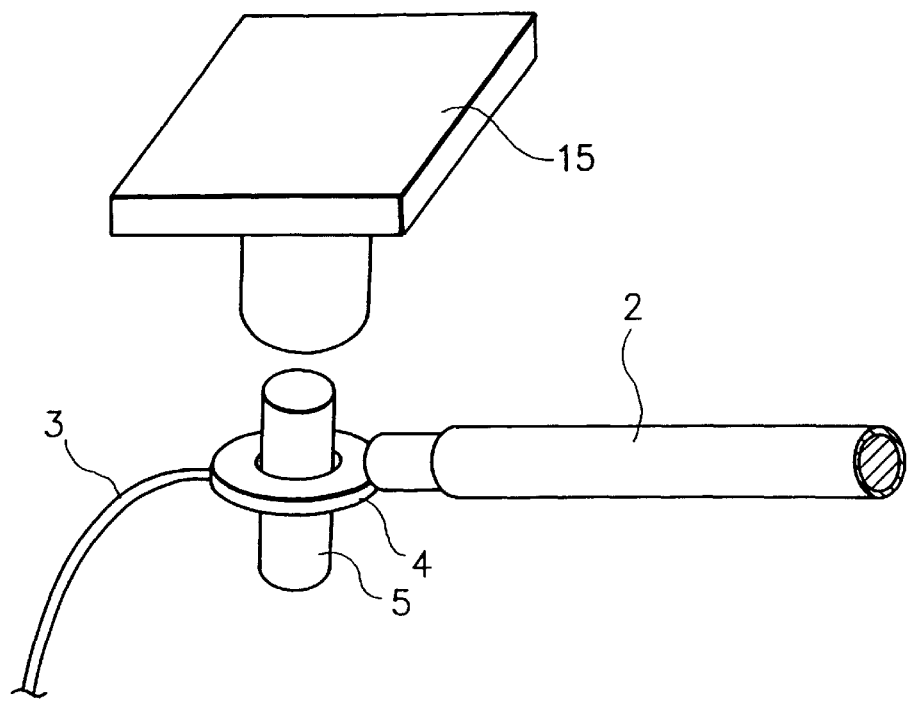
FIGS. 5 and 6 are schematic explanatory views for explaining a manner for engaging a trunk terminal in mesh with a trunk terminal support in the present invention.

A terminal box in this example has such configuration as shown in FIG. 5 which is similar to that described in Example 2. Particularly, as well as in the case of Example 2, a cylindrical trunk terminal support 5 is fixed to a circular trunk terminal 4 by passing the cylindrical trunk terminal support through a latching opening formed at the circular trunk terminal 4 whereby mechanically connecting the circular trunk terminal 4 with the cylindrical trunk terminal support 5 such that the circular trunk terminal is held by the cylindrical trunk terminal support. Thereafter, a head portion of the cylindrical trunk terminal support 5 which is projected above the circular trunk terminal 4 is caulked by way of heat treatment using a heat-fusing device 15.

By this, the circular trunk terminal 4 can be further surely and firmly fixed to the cylindrical trunk terminal support 5.

EXAMPLE 4

Figure 6:
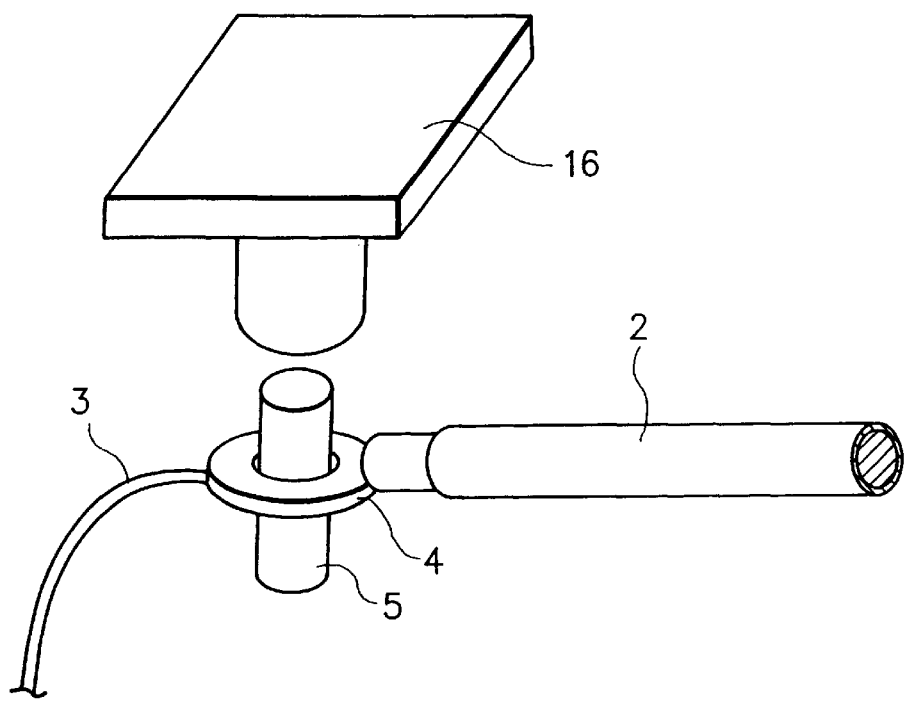

A terminal box in this example has such configuration as shown in FIG. 6 which is similar to that described in Example 2. Particularly, as well as in the case of Example 2, a cylindrical trunk terminal support 5 is fixed to a circular trunk terminal 4 by passing the cylindrical trunk terminal support through a latching opening formed at the circular trunk terminal 4 whereby mechanically connecting the circular trunk terminal 4 with the cylindrical trunk terminal support 5 such that the circular trunk terminal is held by the cylindrical trunk terminal support. Thereafter, a head portion of the cylindrical trunk terminal support 5 which is projected above the circular trunk terminal 4 is caulked by way of ultrasonic treatment using a ultrasonic-fusing device 16. By this, the circular trunk terminal 4 can be further surely and firmly fixed to the cylindrical trunk terminal support 5.

EXAMPLE 5

In this example, the cylindrical trunk terminal support 5 in the configuration described in Example 2 was changed to a cylindrical trunk terminal support comprising two cylindrical components having a different diameter (this cylindrical trunk terminal support will be hereinafter referred to as "two-layered trunk terminal support").

This two-layered trunk terminal support was designed in the following manner.
1. Related factors:

The inherent yield strength of the constituent of the two-layered trunk terminal support is expressed by a $\sigma_y$—(1), the inherent section modulus of the form of the two-layered trunk terminal support is expressed by $Z=\pi d^3/32$—(2) (with d being a diameter of each cylindrical component of the two-layered trunk terminal support), a standardized stress is expressed by P, a length from a position of the two-layered trunk terminal support where the standardized stress P is applied is expressed by L, and a safety factor is expressed by Y.

Under this condition, a maximum bending moment is $M_{max}=PL$—(3), a maximum bending stress is a $\sigma_{max}=M_{max}/Z$—(4), and an allowable stress is $\sigma_a=\sigma_y/Y$.

Therefore, in order to satisfy the relationship of $\sigma_{max} \leq \sigma_a$, based on the equations (3) to (5), there is afforded $M_{max}/Z \leq \sigma_y/Y$—(6), and based on the equations (2) and (6), there is afforded $$d \geq 3\sqrt{\{(32 \times P \times L \times Y)/\pi\sigma_y\}}. \qquad (7)$$

Figure 7A:
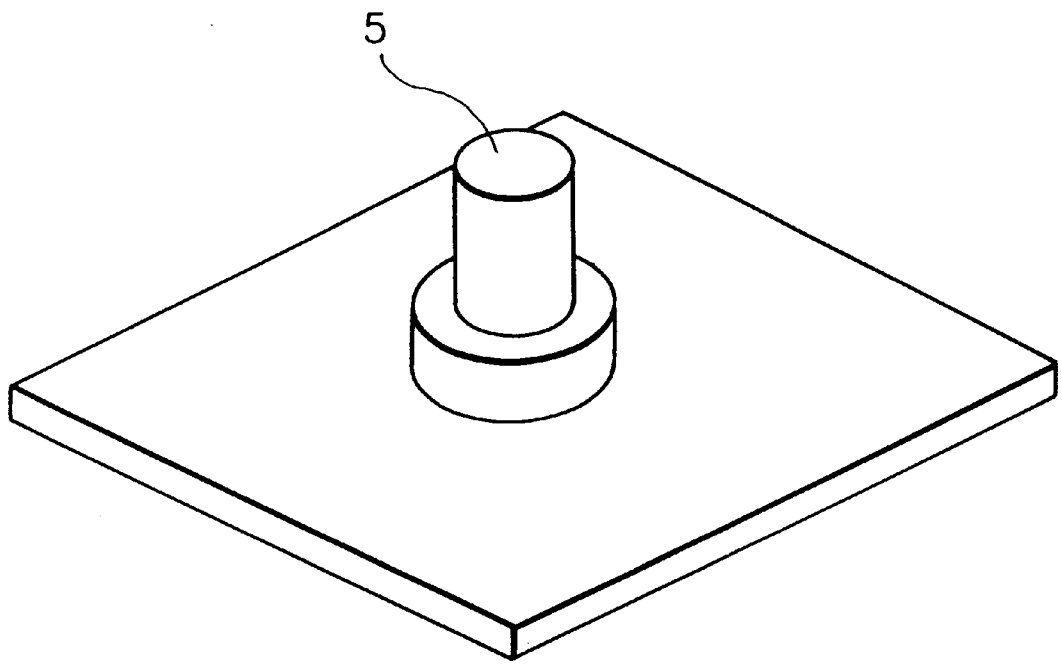
FIG. 7(a) is a schematic slant view.

2. Design of two-layered trunk terminal support:

As the cylindrical trunk terminal support 5 in the configuration described in Example 2, there was employed a two-layered trunk terminal support comprising a cylindrical component (a) having a given diameter situated on a cylindrical component (b) having a greater diameter than that of the cylindrical component (a), as shown in FIG. 7(a).

By means of injection molding, there were prepared a plurality of two-layered trunk terminal supports composed of a resin having an inherent yield strength $\sigma_y$ of 600 kgf/cm$^2$ and having the configuration shown in FIG. 7.

In this case, each of the two cylindrical components (a) and (b) for each trunk terminal support was designed to satisfy the equation (7) and have a different diameter.

Figure 7B:
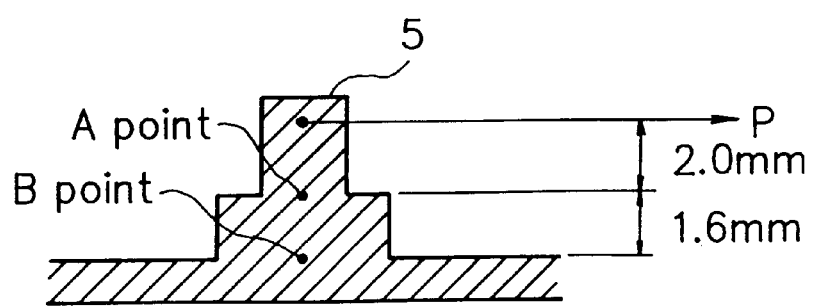
FIG. 7(b) is a schematic cross-sectional view.

And, as shown in FIG. 7(b), each trunk terminal support was designed to satisfy conditions that the length $L_A$ from a given point (where the standardized stress P is applied) to the point A is $L_A=2.0$ mm, and the length $L_B$ from a given point (where the standardized stress P is applied) to the point B is $L_B=3.6$ mm.

Each of the resultant trunk terminal supports was subjected to a destructive test under the condition of applying a load of 15 kgf as the standardized stress P in order to examine a necessary diameter for the point A (see, FIG. 7(b)) [that is, a necessary diameter of the cylindrical component (a)] and a necessary diameter for the point B (see, FIG. 7(b)) [that is, a necessary diameter of the cylindrical component (b)] in relation to a given safety factor Y in the range of 1.0 to 2.0.

As a result, the three trunk terminal supports each comprising a cylindrical component (a) having a diameter as shown in the column "necessary diameter d (mm) at the point A" of Table 1 and a cylindrical component (b) having a diameter as shown in the column "necessary diameter d (mm) at the point B" of Table 1 which is greater than the diameter of the cylindrical component (a) were found to be substantially free of rupture or crack in the destructive test.

And each of these three trunk terminal supports was used as the cylindrical trunk terminal support 5 in the terminal box described in Example 2. As a result, there was established a highly reliable integrated power outputting unit having a good performance in the terminal box.

Based on the results, there were obtained findings as will be described in the following. By designing the trunk terminal support 5 such that it is thickened on the side of the fixed face 11 of the terminal box (see, FIG. 4), specifically, it has a greater cross-section in the direction in which a force is applied by the trunk terminal 4, the resistance to load of the trunk terminal support is desirably improved.

This situation is similar in the case where the trunk terminal support is designed to have a cross-section in a rectangular form.

TABLE 1

| safety factor | necessary diameter d (mm) at the point A | necessary diameter d (mm) at the point B |
|---|---|---|
| 1.0 | 0.38 | 0.46 |
| 1.5 | 0.43 | 0.52 |
| 2.0 | 0.47 | 0.57 |

EXAMPLE 6

This example is the same as Example 1, except that the connection manner previously described with reference to FIG. 3 in which the trunk terminal 4 is connected with the trunk terminal support 5 is employed.

This example is different from Example 1 only with the following points.

In this example, the trunk terminal 4 in Example 1 is changed to a trunk terminal provided with a pair of meshing portions 18 (see, FIG. 3), and the trunk terminal support 5 in Example 1 is changed to a trunk terminal support having a bored latching portion provided with a pair of receiving members 17 (see, FIG. 3) in which the pair of meshing portions 18 are to be engaged.

Particularly, in this example, the trunk terminal 4 is mechanically connected with the trunk terminal support 5 simply by the snap-fitting connection manner previously described with reference to FIG. 3. That is, the meshing portions 18 of the trunk terminal 4 are inserted into the bored latching portion of the trunk terminal support 5 to engage the meshing portions 18 of the trunk terminal 4 in the receiving members 17 of the trunk terminal support 5.

In the structure of this example, as well as in the case of Example 1, an external force transmitted from the externally power outputting cable 2 is substantially not applied to the electrode-taking out portion (of the solar cell module) from which the internal lead wire is extended.

And the wirings in the terminal box 1 can be firmly and surely conducted by extremely simple routine work.

Figure 8:
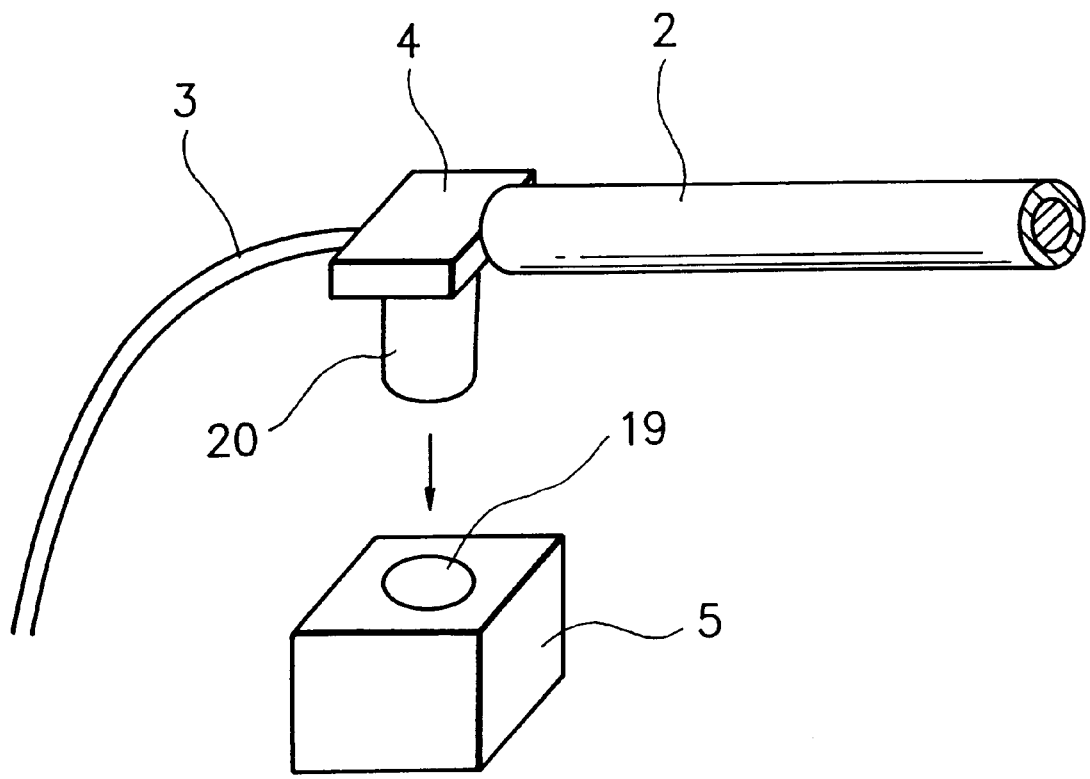

By the way, the mechanical connection of the trunk terminal 4 with the trunk terminal support 5 may be also conducted such a press-fitting connection manner as shown in FIG. 8.

That is, the trunk terminal 4 is designed to have a projected portion 20 as shown in FIG. 8, the trunk terminal support 5 is designed to have an opening 19 as shown in FIG. 8 which is fit to the projection 20 of the trunk terminal 4, and the projection 20 of the trunk terminal 4 is press-fitted into the opening 19 of the trunk terminal support 5, whereby the trunk terminal 4 is mechanically connected with the trunk terminal support 5. In this case, there can be also attained a desired, integrated power outputting unit.

As apparent from the above description, in the terminal box according to the present invention, the externally power outputting cable and the internal lead wire are electrically and mechanically connected to each other through the trunk terminal to establish a highly reliable integrated connection structure (a highly reliable integrated power outputting unit). This integrated connection structure in the terminal box can attain a simple connection manner as previously described, using a small number of parts involved. This situation provides a highly reliable terminal box at a reasonable cost.

Further, in the present invention, the trunk terminal through which the externally power outputting cable and the internal lead wire are electrically and mechanically connected to each other is firmly fixed to the trunk terminal support by mechanically connecting the trunk terminal with the trunk terminal support as previously described. Hence, an external force transmitted from the externally power outputting cable is applied to the fixed face of the terminal box through the trunk terminal support and because of this, the electrode-taking out portion of the solar cell module from which the internal lead wire is extended is substantially not suffered from the external force from the externally power outputting cable.

The present invention provides also such advantages as will be described in the following. That is, the operation for establishing the foregoing integrated connection structure in the terminal box can be efficiently conducted simply by passing the trunk terminal support through the latching portion bored at the trunk terminal whereby mechanically connecting the trunk terminal with the trunk terminal support or by inserting the meshing portions provided at the trunk terminal into the bored latching portion (provided with the receiving members) of the trunk terminal support to engage the meshing portions of the trunk terminal in the receiving members of the trunk terminal support whereby mechanically connecting the trunk terminal with the trunk terminal support. This situation attains highly reliable terminal box products which are substantially free of not only a variation in terms of not only the strength but also the electrical performance among the products.

As a whole, the present invention attains a highly reliable terminal box which is less expensive and can be readily installed with a good working efficiency, and a desirable solar cell module provided with said terminal box.

What is claimed is:

1. A terminal box which is provided at an electrode-taking out portion of a solar cell module, said terminal box comprising:
    a side face having a portion for threading an externally power-outputting cable, and a portion for adopting an internal lead wire extended from the electrode-taking out portion of the solar cell module; and
    a trunk terminal support for retaining a trunk terminal capable of mechanically and electrically connecting the externally power-outputting cable and the internal lead wire with each other.

2. A terminal box according to claim 1, wherein the internal lead wire and the externally power outputting cable are structurally integrated by the trunk terminal.

3. A terminal box according to claim 1, wherein said portion for threading the externally power outputting cable comprises an opening.

4. A terminal box according to claim 1, wherein said trunk terminal support is formed of a material capable of being caulked by heat treatment.

5. A terminal box according to claim 1, wherein said trunk terminal support is formed of a material capable of being caulked by ultrasonic treatment.

6. A terminal box according to claim 1, wherein said trunk terminal support is formed of a resin.

7. A terminal box according to claim 1, wherein said trunk terminal support has a cross section which is enlarged on a side of a portion on which said trunk terminal support is held.

8. A terminal box according to claim 1, wherein said trunk terminal support has a cross section in a circular form.

9. A terminal box according to claim 1, wherein said trunk terminal support has a cross section in a rectangular form.

10. A terminal box according to claim 1, wherein said trunk terminal support has a fixing portion to fix the trunk terminal.

11. A terminal box according to claim 1, wherein said trunk terminal support has an opening to press-fit the trunk terminal.

12. A terminal box according to claim 1, wherein said trunk terminal support has a portion to snap-fit the trunk terminal.

13. A terminal box according to claim 1, wherein said trunk terminal support has a structure to satisfy an equation $\sigma_{max} \leq \sigma_a$, where, $\sigma_{max} = M_{max}/Z$, $\sigma_a = \sigma_y Y$, $M_{max}$ is an inherent maximum bending moment for a form of said trunk terminal support in relation to a standardized stress applied to said trunk terminal support, Z is an inherent section modulus of the form of said trunk terminal support, $\sigma_y$ is an inherent yield strength of a constituent of said trunk terminal support, and Y is a safety factor.

14. A terminal box according to claim 1, wherein said trunk terminal support has a meshing portion to engage in the trunk terminal, said meshing portion being provided at said trunk terminal support such that said meshing portion is projected in a direction toward the inside of the terminal box.

15. A terminal box according to claim 1, wherein each of the externally power-outputting cable and the internal lead wire is mechanically and electrically connected to a different position of the trunk terminal.

16. A solar cell module comprising:
a photovoltaic element sealed by a sealing material;
an electrode-taking out portion having an internal lead wire for outputting power generated by said photovoltaic element;
an externally power-outputting cable for externally outputting the power outputted through said internal lead wire to the outside through a trunk terminal; and
a terminal box provided at said electrode-taking out portion, wherein said terminal box comprises a side face having a portion for threading said externally power-outputting cable, a portion for adopting said internal lead wire, and a trunk terminal support for retaining said trunk terminal through which said externally power-outputting cable and said internal lead wire are mechanically and electrically connected with each other.

17. A solar cell module according to claim 16, wherein said internal lead wire and said externally power outputting cable are structurally integrated by said trunk terminal.

18. A solar cell module according to claim 16, wherein said portion for threading said externally power outputting cable comprises an opening.

19. A solar cell module according to claim 16, wherein said trunk terminal support is formed of a material capable of being caulked by heat treatment.

20. A solar cell module according to claim 16, wherein said trunk terminal support is formed of a material capable of being caulked by ultrasonic treatment.

21. A solar cell module according to claim 16, wherein said trunk terminal support is formed of a resin.

22. A solar cell module according to claim 16, wherein said trunk terminal support has a cross section which is enlarged on a side of a portion on which said trunk terminal support is held.

23. A solar cell module according to claim 16, wherein said trunk terminal support has a cross section in a circular form.

24. A solar cell module according to claim 16, wherein said trunk terminal support has a cross section in a rectangular form.

25. A solar cell module according to claim 16, wherein said trunk terminal support has a first fixing portion to fix said trunk terminal.

26. A solar cell module according to claim 25, wherein said trunk terminal has a second fixing portion capable of being meshed with said first fixing portion of said trunk terminal support.

27. A solar cell module according to claim 16, wherein said trunk terminal support has an opening to press-fit said trunk terminal.

28. A solar cell module according to claim 27, wherein said trunk terminal has a projected portion which is inserted into the opening of said trunk terminal support.

29. A solar cell module according to claim 16, wherein said trunk terminal support has a portion to snap-fit said trunk terminal.

30. A solar cell module according to claim 16, wherein said trunk terminal support has a structure to satisfy an equation $\sigma_{max} \leq \sigma_a$, where, $\sigma_{max} = M_{max}/Z$, $\sigma_a = \sigma_y Y$, $M_{max}$ is an inherent maximum bending moment for a form of said trunk terminal support in relation to a standardized stress applied to said trunk terminal support, Z is an inherent section modulus of said form of said trunk terminal support, $\sigma_y$ is an inherent yield strength of a constituent of said trunk terminal support, and Y is a safety factor.

31. A solar cell module according to claim 16, wherein said trunk terminal has an opening into which said trunk terminal support is inserted.

32. A solar cell module according to claim 16, wherein said trunk terminal is press-fitted with said trunk terminal support.

33. A solar cell module according to claim 16, wherein said trunk terminal is snap-fitted with said trunk terminal support.

34. A solar cell module according to claim 16, wherein a pair of terminal boxes are provided at said electrode-taking out portion. provided at said trunk terminal support such that said meshing portion is projected in a direction toward the inside of said terminal box.

35. A solar cell module according to claim 16, wherein each of said externally power-outputting cable and said internal lead wire is mechanically and electrically connected to a different position of said trunk terminal.

36. An electrical connection structure comprising:
a terminal box which covers an electrode-taking out portion of a solar cell module, said terminal box having a side face provided with an opening for threading an externally power-outputting cable and a bottom face provided with an opening for receiving an internal lead wire from said electrode-taking out portion,
wherein said terminal box includes a trunk terminal and a trunk terminal support provided in said terminal box, said trunk terminal support having a mechanically retaining portion for mechanically retaining said trunk terminal, with said externally power-outputting cable and said internal lead wire mechanically and electrically connected with each other into an integrated structure through said trunk terminal, and said trunk terminal being mechanically connected on said trunk terminal support through said mechanically retaining portion of said trunk terminal support.

37. An electrical connection structure according to claim 36, wherein said trunk terminal has a fixing portion to fix said trunk terminal support, and said trunk terminal is mechanically connected to said trunk terminal support through said fixing portion.

38. An electrical connection structure according to claim 37, wherein said trunk terminal support comprises a resin, and said trunk terminal is fixed to said trunk terminal support in a state that said trunk terminal is retained on said trunk terminal support.

39. An electrical connection structure according to claim 38, wherein a part of said trunk terminal support is caulked by way of heat treatment.

40. An electrical connection structure according to claim 38, wherein a part of said trunk terminal support is caulked by way of ultrasonic treatment.

41. An electrical connection structure according to claim 36, wherein a part of said trunk terminal support is caulked by way of heat treatment.

42. An electrical connection structure according to claim 36, wherein a part of said trunk terminal support is caulked by way of ultrasonic treatment.

43. An electrical connection structure according to claim 36, wherein said trunk terminal support has a structure which satisfies an equation $\sigma_{max} \leq \sigma_a$, where $\sigma_{max} = M_{max}/Z$, $\sigma_a = \sigma_y/Y$, $M_{max}$ is an inherent maximum bending moment for a form of said trunk terminal support in relation to a standardized stress applied to said trunk terminal support, Z is an inherent section module of the from of said trunk terminal support, $\sigma_y$ is an inherent yield of a constitution of said trunk terminal support, and Y is a safety factor.

44. An electrical connection structure according to claim 36, wherein one of said trunk terminal and said trunk terminal support has a first fixing portion and the other has a second fixing portion to engage with said first fixing portion, and said trunk terminal and said trunk terminal support are mechanically retained by engaging said first and second fixing portions with each other.

45. An electrical connection structure according to claim 44, wherein said two fixing portions are press-fitted or snap-fitted.

46. An electrical connection structure according to claim 36, wherein each of said externally power-outputting cable and said internal lead wire is mechanically and electrically connected to a different position of said trunk terminal.

* * * * *

UNITED STATES PATENT AND TRADEMARK OFFICE
CERTIFICATE OF CORRECTION

PATENT NO. : 6,166,321
DATED : December 26, 2000
INVENTOR(S) : Makoto Sasaoka et al.

It is certified that error appears in the above-identified patent and that said Letters Patent is hereby corrected as shown below:

Column 12,
Line 19, "said" (first occurrence) should read -- the --.
Line 30, "a" should be deleted.
Line 31, "pair of terminal boxes are provided at said electrode-taking" should read -- said trunk terminal support has a meshing portion to engage in said trunk terminal, said meshing portion being --.
Line 32, "out portion." should be deleted.

Column 13,
Line 19, "from" should read -- form --.

Column 14,
Line 17, insert Claim 47 as follows:
-- 47. A solar cell module according to claim 16, wherein a pair of terminal boxes are provided at said electrode-taking out portion. --.

Signed and Sealed this

Fifth Day of March, 2002

Attest:

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO. : 6,166,321 Page 1 of 1
DATED : December 26, 2000
INVENTOR(S) : Makoto Sasaoka et al.

It is certified that error appears in the above-identified patent and that said Letters Patent is hereby corrected as shown below:

Column 12,
Line 19, "said" (first occurrence) should read -- the --.
Line 30, "a" should be deleted.
Line 31, "pair of terminal boxes are provided at said electrode-taking" should read -- said trunk terminal support has a meshing portion to engage in said trunk terminal, said meshing portion being --.
Line 32, "out portion." should be deleted.

Column 13,
Line 19, "from" should read -- form --.

Column 14,
Line 17, insert Claim 47 as follows:
-- 47. A solar cell module according to claim 16, wherein a pair of terminal boxes are provided at said electrode-taking out portion. --.

Signed and Sealed this

Twentieth Day of August, 2002

Attest:

JAMES E. ROGAN
Attesting Officer                Director of the United States Patent and Trademark Office